US008305847B2

(12) United States Patent
Tseng et al.

(10) Patent No.: US 8,305,847 B2
(45) Date of Patent: *Nov. 6, 2012

(54) ULTRA HIGH RESOLUTION TIMING MEASUREMENT

(75) Inventors: Nan-Hsin Tseng, Shanhua Township (TW); Chin-Chou Liu, Jhubei (TW); Saurabh Gupta, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/110,735

(22) Filed: May 18, 2011

(65) Prior Publication Data

US 2011/0273967 A1 Nov. 10, 2011

Related U.S. Application Data

(63) Continuation of application No. 12/757,396, filed on Apr. 9, 2010, now Pat. No. 7,986,591.

(60) Provisional application No. 61/234,052, filed on Aug. 14, 2009.

(51) Int. Cl.
*G04F 8/00* (2006.01)
*G01R 13/02* (2006.01)

(52) U.S. Cl. ...... 368/118; 368/119; 368/120; 324/76.55

(58) Field of Classification Search .................. 368/113, 368/118, 120, 119; 324/76.15, 76.16, 76.55, 324/76.58, 76.82; 327/31, 33, 51, 144; 377/19, 377/20; 702/79
See application file for complete search history.

(56) References Cited

U.S. PATENT DOCUMENTS

| | | | |
|---|---|---|---|
| 4,678,345 | A | 7/1987 | Agoston |
| 7,368,931 | B2 | 5/2008 | Kim |
| 7,564,897 | B2 | 7/2009 | Ichiyama et al. |
| 7,809,521 | B1 | 10/2010 | Burke et al. |
| 2002/0034125 | A1 | 3/2002 | Elfman |
| 2003/0006750 | A1 | 1/2003 | Roberts et al. |
| 2003/0076181 | A1 | 4/2003 | Tabatabaei et al. |
| 2003/0098731 | A1 | 5/2003 | Tabatabaei et al. |
| 2003/0210028 | A1 | 11/2003 | Beach et al. |
| 2009/0256601 | A1 | 10/2009 | Zhang et al. |

*Primary Examiner* — Vit W Miska
(74) *Attorney, Agent, or Firm* — Lowe Hauptman Ham & Berner, LLP

(57) ABSTRACT

A method for high-resolution timing measurement includes a first oscillator generating a first clock with a first frequency. A second oscillator generates a second clock with a second frequency. A delay pulse generator generates a delayed pulse from the second clock. An oscillator tuner controls the second frequency to be as close as possible to the first frequency without being the same as the first frequency. A sampling module samples the delayed pulse at the first frequency. A counter generates a digital counter value by counting a number of samples made by the sampling module.

20 Claims, 6 Drawing Sheets

ULTRA HIGH RESOLUTION TIMING MEASUREMENT

CROSS-REFERENCE TO RELATED APPLICATIONS

The present application is a continuation application of U.S. patent application Ser. No. 12/757,396, filed on Apr. 9, 2010, which claims priority of U.S. Provisional Patent Application Ser. No. 61/234,052 filed on Aug. 14, 2009, the entire disclosures of which are incorporated herein by reference.

TECHNICAL FIELD

This disclosure relates generally to high-resolution timing measurement for integrated circuits.

BACKGROUND

As the miniaturization of integrated circuits progresses, the measurement of timing parameters is a big challenge. Two main challenges are to measure the timing width of a very small pulse with high accuracy in any general digital circuit and to achieve a high resolution, e.g., around 1 ps.

The small pulse width measurement is an important step for many applications, for example: 1) exact timing characterization of silicon standard cells library, 2) measuring the critical path delay time on the chip in silicon, 3) measuring actual hold time on the chip in silicon, 4) measuring rising and fall slew rate on chip in silicon, and 5) SRAM access time detection, etc.

However, very accurate timing characteristics for cell delay measurement are very difficult to achieve with high resolution due to scaling values of cell timing characteristics with scaling technology and limitations on automatic tester equipment (ATE) such as coarse resolution, etc. Conventional methods suffer from very low resolution, have difficulty getting the on-chip digital data, capturing large volumes of data in short time, and measuring rise and fall slew rate using normal ATE. Also, they require using a long delay chains or averaging out mechanism to overcome problems of coarse resolution, etc.

Accordingly, new methods for high-resolution timing measurement with better accuracy are desired.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of invention.

An integrated circuit to achieve high-resolution timing measurement is provided. Throughout the various views and illustrative embodiments of the present disclosure, like reference numbers are used to designate like elements.

Figure 1:
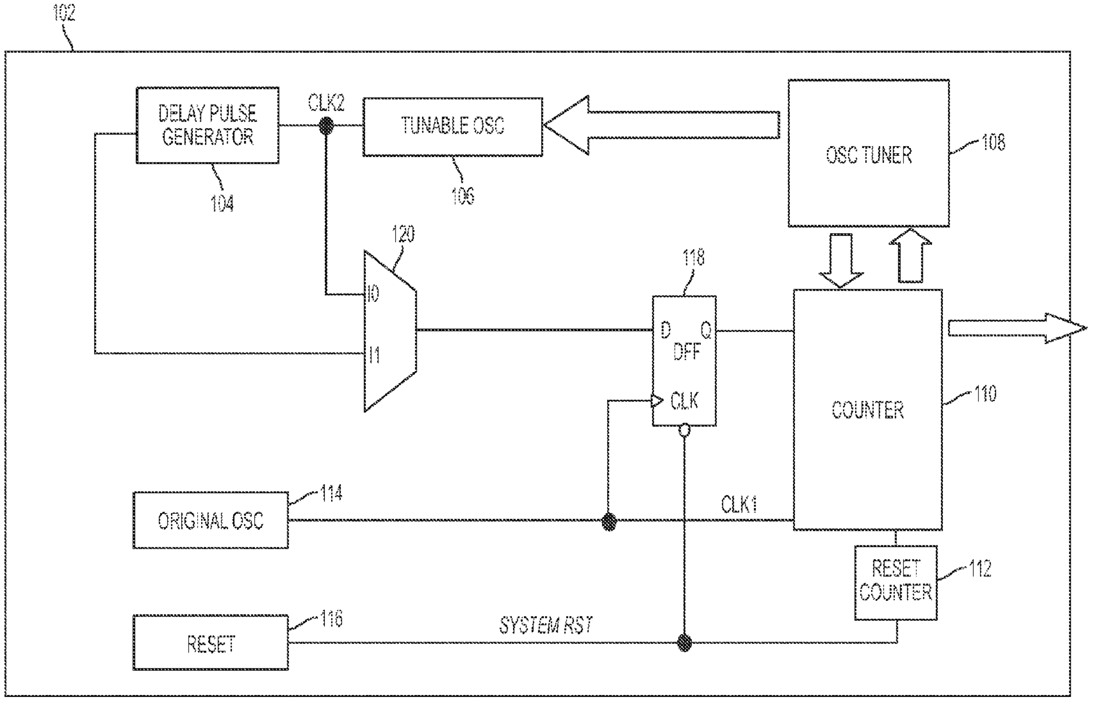
FIG. 1 illustrates an exemplary structure of equivalent time sampling circuit using differential clock for ultra high resolution timing measurement according to one aspect of the present disclosure.

FIG. 1 illustrates an exemplary structure of equivalent time sampling circuit using differential clock for ultra high resolution timing measurement according to one aspect of the present disclosure. The circuit 102 includes a delay pulse generator 104, a tunable oscillator 106, an oscillator tuner 108, a counter 110, a reset counter 112, an original oscillator 114, a reset module 116, a D flip-flop (DFF) 118, and a multiplexer (MUX) 120.

Figure 2:
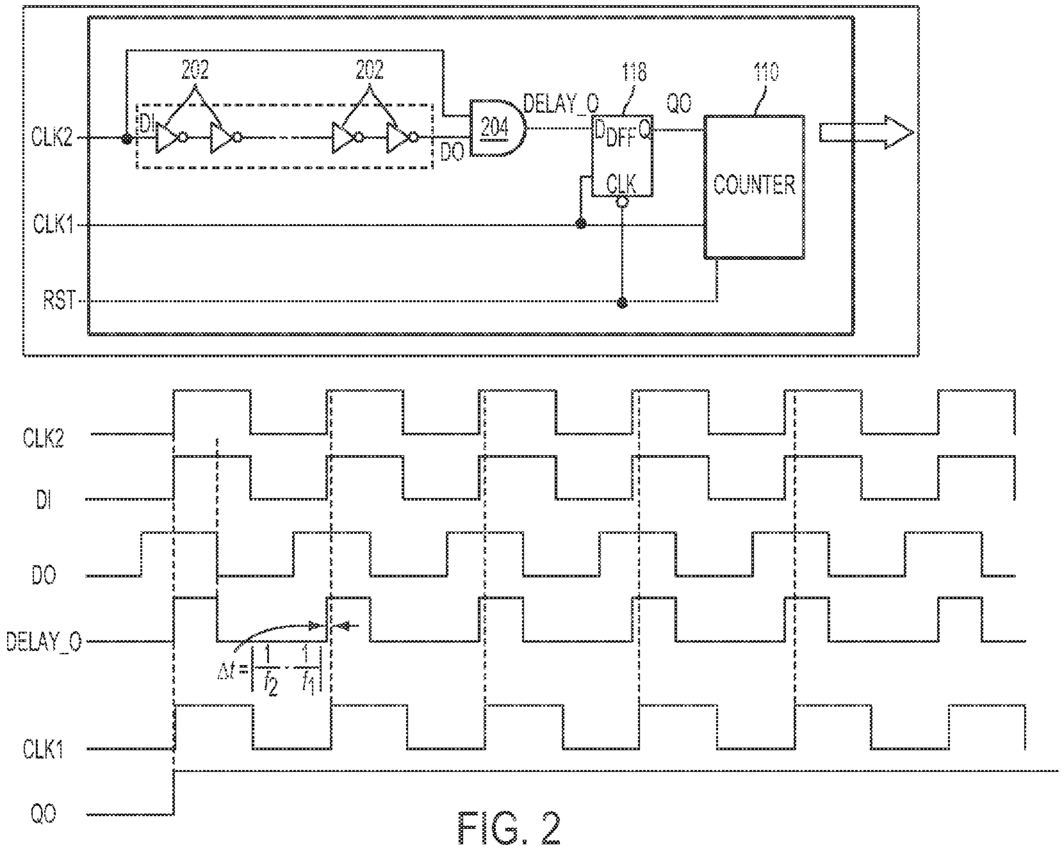
FIG. 2 illustrates an exemplary delay pulse generator and related signals, beginning when the first clock and the second clock are aligned.
Figure 3:
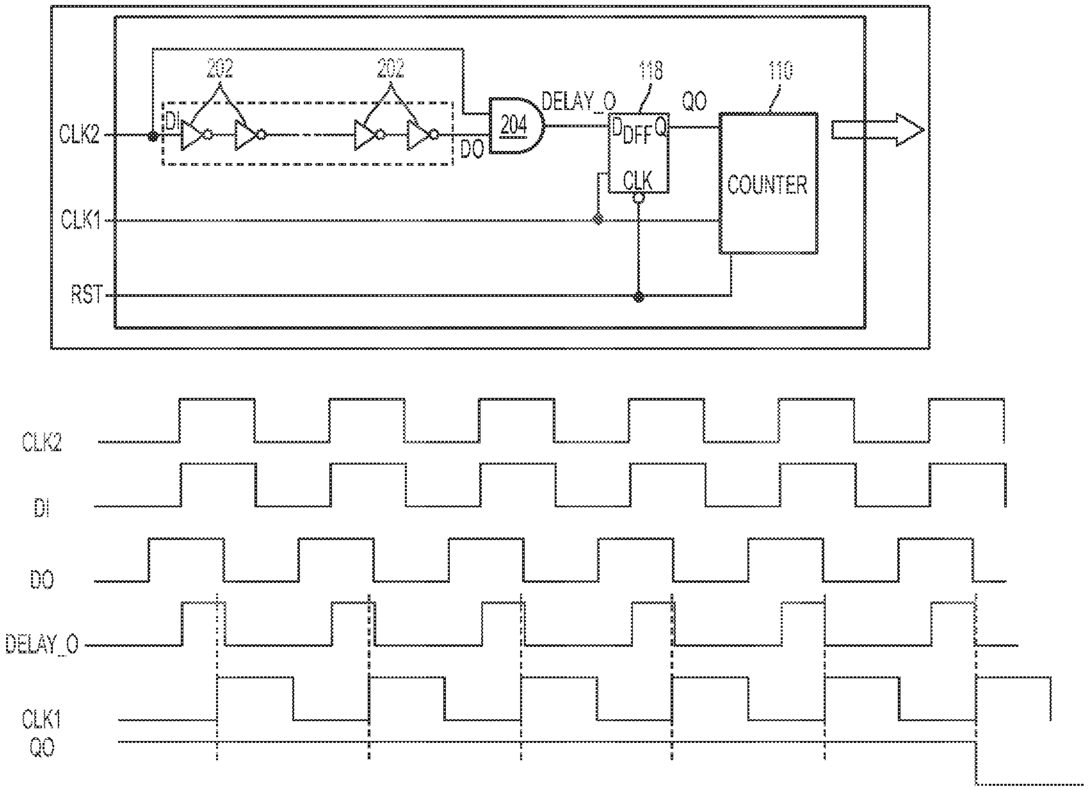
FIG. 3 illustrates an exemplary delay pulse generator and related signals, as QO changes to zero.
Figure 4:
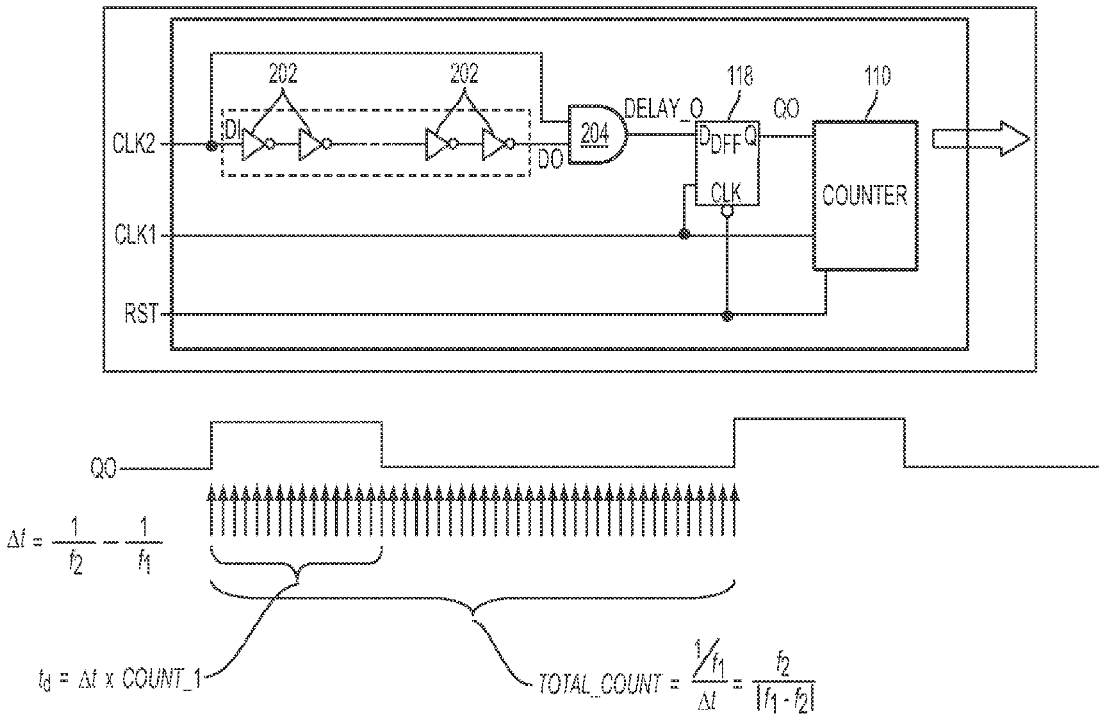
FIG. 4 illustrates an exemplary delay pulse generator and the D flip-flop (DFF) output OQ that is connected to the counter.

The delay pulse generator 104 can be any generic block, which generates a very small pulse to be measured. For example, the pulse can be generated by two parallel paths, one of which containing array of inverters in series while the other path connected directly to the input of an AND gate, as shown in FIG. 2-FIG. 4. Other possible blocks could be a slew rate detection block, and setup/hold time margin detection block, etc.

Figure 5:
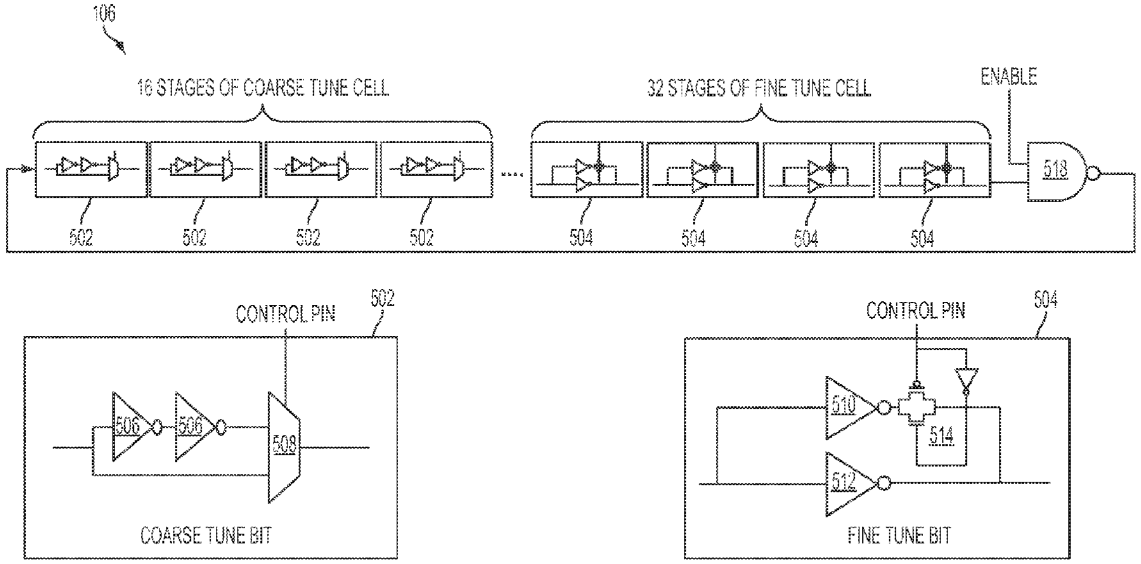
FIG. 5 illustrates an exemplary tunable ring oscillator with coarse tune and fine tune cells to achieve high resolution.

The tunable oscillator 106 is a digitally tunable oscillator whose frequency can be tuned directly from a digital control to match up the frequency of the original oscillator 114. It can include coarse tuning as well as fine-tuning functionality to provide good digital control for the tuning as shown in FIG. 5. One example is that the coarse tune step size is 53.1 ps with 16 steps and fine tune step size is 1.7 ps with 32 steps. The main advantage of this block is the frequency tuning capability to the highest resolution with very high granularity, which is very difficult with conventional methods even if a voltage controlled oscillator (VCO) is used. And this tuning is based on a robust ring oscillator design, thus less susceptible to failures due to integrated circuit process defects.

The oscillator tuner 108 is a state machine, which can automatically tune the tunable oscillator 106 to the original oscillator 114 frequency till the highest possible resolution is achieved for a given oscillator. An automatic frequency-tuning algorithm can be used and the state machine design can incorporate the functionality for automatic tuning to the highest resolution based on the input reference frequency. An exemplary algorithm for the state machine is described in FIG. 6.

The counter 110 also functions as a statistical computational block. This is the generic block that has the functionality of basic counters along with additional functionality. Computational capabilities can be added to this counter block, such as 1) statistical computation by measuring pulse width for a given number of times, e.g. 100 times, 2) ignore initial unstable pulses and wait for stable pulses, 3) ability to convert parallel counter data into serial output, and 4) parallel counters to count not only high pulse time but also low pulse time.

The reset counter 112 counts how many times the reset signal has been applied to the counter (and statistical computational block) 110 for resetting the sampling DFF 118 or counter 110. Based on this value certain computational decisions can be made in the oscillator tuner 108 and the counter 110. DFF 118 can detect the phase of differential clocks by sampling one clock at the frequency of another clock.

There are two functional stages: one is an oscillator tuning stage and the other is a measurement stage. At the oscillator tuning stage, when the system is initially turned on after the reset, the path 10 through the MUX 120 is turned on, which feeds in the tunable oscillator 106 to DFF 118 that is clocked by the reference original oscillator 114 frequency. Using counter (and statistical computational block) 110 and oscillator tuner 108's state machine, the frequency of tunable oscillator 106 is tuned to highest possible resolution for the system (i.e. the minimal possible difference between the two clock frequencies). The design also can optionally choose a resolution threshold required in case it is not possible to achieve a stable frequency by tuning.

At the measurement stage, after the counter becomes stable (i.e. the sample counts are stable for the frequency difference of the reference oscillator 114 and the tunable oscillator 106), oscillator tuner 108 turns on the delay pulse path through 11 of the MUX 120. The pulse width of the delay pulse is measured in terms of digital counter value using the equivalent time sampling (ETS) method based on differential clocks. The digital counter value can be shifted out from the counter (and Statistical computational block) 110 for further processing.

The circuit 102 uses ETS to achieve high-resolution measurement using a lower frequency clock. For the pulse timing measurement, a periodic repeating pulse is required whose width needs to be measured. Two differential clocks with small time difference are used to achieve ETS as described below.

FIG. 2 illustrates an exemplary delay pulse generator and related signals, beginning when the first clock and the second clock are aligned. When the measurement phase begins, the first clock (clock 1 or CLK1) and the second clock (clock 2 or CLK2) can be perfectly aligned automatically. The counter can count only when they are perfectly aligned and in phase because then only CLK1 will be able to sample the generated delay pulse (Delay 0) as high, resulting in QO to be high which in turn enable the counter. Clock 2 goes through inverter 202 chain to an AND gate 204 input as well as a direct input to the AND gate 204. The input to the inverter 202 chain is DI and the output is DO, which is in turn an input to the AND gate 204. The inverter 202 chain will introduce some delay in the path. Hence DELAY_0, which is the output of AND gate 204, is a pulse with its width equal to the delay induced by the inverter 202 chain.

When Clock 1 and Clock 2 align perfectly, clock 1 that is the clock input to the DFF 118, will be able to sample DELAY_0 pulse that is the input to the DFF 118. Hence QO that is the output of the DFF 118, will be high as shown. The QO enables the counter 110 to start counting on the Clock 1.

As clock 2 has very a small difference to clock 1 in the period (or frequency), it will start shifting gradually in small steps Δt with each clock cycle. And this small shift in time Δt is determined by their frequency difference, which is made as small as possible using oscillator tuner block 108. This shift is indicated by dotted vertical lines in FIG. 2.

Resolution of the timing measurement determined by the difference of two clocks as defined by the following equation:

$$\Delta t = |\text{period\_2} - \text{period\_1}| = \left|\frac{1}{f2} - \frac{1}{f1}\right|, \quad \text{(Eq. 1)}$$

where period_2 and period_1 are time periods of the two clocks, and f2 and f1 are the frequencies of the two clocks, measured directly or applied from a known source.

FIG. 3 illustrates an exemplary delay pulse generator and related signals, as QO changes to zero. Due to shifting in time with the step size of their frequency difference, an instance happens when the delayed clock 2, i.e. DO, and clock 1 are totally out of phase. At this out of phase state, clock 1 cannot sample DELAY_0 pulse and hence the QO will be low and hence the counter 110 stops counting for the high time pulse.

FIG. 4 illustrates an exemplary delay pulse generator and the D flip-flop (DFF) output QO that is connected to the counter. As long as clock 1 is able to sample the DELAY_0 signal, QO stays high and hence counter 110 running on clock 1 can sample QO. The arrow under QO indicates the edge of the clock 1 that samples the QO to increment the counter 110, and keep counting till the delayed clock 2, i.e. DO, and clock 1 are totally out of phase.

As the result, a very small pulse DELAY_0 that was very difficult to measure, has been translated to long pulse QO using differential clock ETS method. The counter 110 not only counts when QO is high, but also can have a parallel counter which can also count till next time QO goes high. This also enables to calculate the time for which DELAY_0 pulse is low.

FIG. 5 illustrates an exemplary tunable ring oscillator with coarse tune and fine tune cells to achieve high resolution. The tunable ring oscillator 106 contains two components, i.e. coarse tune bit stage 502 and fine tune bit stage 504, connected to a NAND gate 518 with an enable input to form a ring.

The coarse tune bit stage 502 single stage (coarse tuning stage) has the stage input connected to a 2-to-1 MUX 508 through two inverters 506 and also the same input connected to the MUX 508 directly. As a result when the path connected through inverters 506 is turned on through MUX selection hit, the delay of the stage increases, which lowers the frequency of the ring oscillator 106. And when direct path is turned on by MUX 508 selection bit, the delay through the path is decreased, which increases the frequency of the ring oscillator 106. So when multiple such stages, e.g. 16 stages in FIG. 5, are connected in the ring oscillator 106, each single stage can be individually turned off and turned on to tune the frequency in certain step size that corresponds to each stage. The coarse tune bit module step size is relatively large compared to the fine tune hit stage 504 described below. For example, the step size can be chosen as 53.1 ps. However, the step size can be changed depending on the application requirement.

The number of stages of 16 and inverter gates number of 2 used in this implementation need not to be a fixed number. The number of inverters and inverter size (drive strength) chosen for each design application depends on the step size required, and the number of stages depends on the range of frequency required for the ring oscillator 106.

The fine tune bit stage 504 single stage (fine tuning stage) consists of two inverters 510 and 512 connected in parallel with one arm connected through CMOS pass transistor gate 514. When the pass gate 514 is turned on by setting the control pin to 1, both the inverters come in parallel in the path, which effectively increase the drive strength of that single stage. Therefore, the delay for that stage is reduced, resulting in increased frequency of the ring oscillator 106. Similarly when the pass gate 514 is turned off by setting control pin to 0, only a single inverter 512 exists in the path, reducing the effective drive strength along the path. Therefore, the delay is increased for that stage, which decreases the frequency. By doing so, a desired resolution in frequency of the ring oscillator 106 can be controlled in small steps, e.g. 1.7 ps for this implementation.

Also, the inverter 510 and 512 gate size can be chosen appropriately to achieve desired resolution. After deciding the delay step size for fine tuning, the number of stages can be chosen such that when all are turned off and all are turned on, the frequency/delay difference is approximately the same as a single step size of the coarse tune bit stage 502. For example, with 32 stages of fine tune bit stages 504 and each fine tune bit stage 504 has 1.7 ps step, 1.7 ps*32=54.4 ps, which is approximately the same as single step size of a coarse tune bit stage 502, e.g. 53.1 ps. The circuit of oscillator tuner 108 can adjust the frequency of tunable ring oscillator 106 automatically to achieve small time/frequency difference between clock 1 and clock 2.

The circuit design for each application should target for the highest resolution desired, however the resolution can be adjusted according to technology node and various design constraints. Also, to reduce the impact of OSC jitter, the mean value of multiple measurements, e.g., 100 times, can be calculated.

Figure 6:
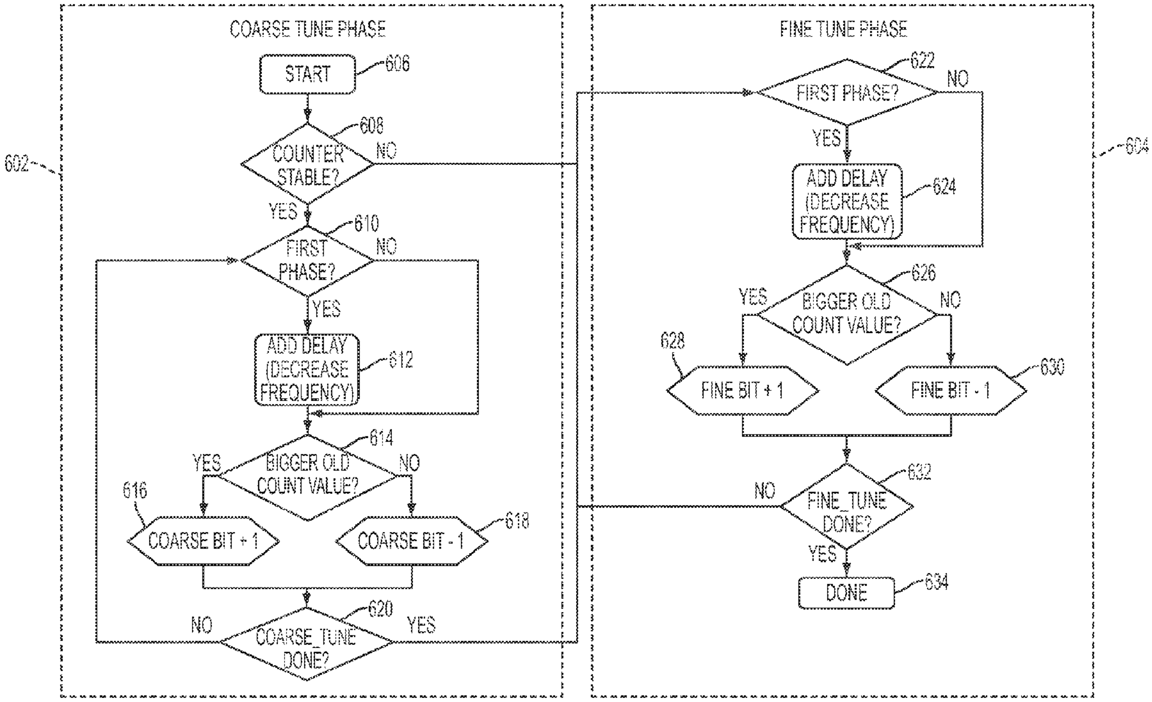
FIG. 6 illustrates an exemplary flow chart showing the oscillator tuner control process.

FIG. 6 illustrates an exemplary flow chart showing the oscillator tuner control process. There are coarse tune phase 602 and fine tune phase 604. At the start of the state machine at 606, the Oscillator tuner 108 runs the counter 110 to check whether a stable counter value can be detected or not at 608. The stable counter value indicates that clocks are sufficiently apart and stable over a period of time so that their difference can be detected and used for measurement. The unstable counter value indicates that the clocks are too close and their difference is very small to be easily detected and to be used for the measurement.

From the first step of coarse tune phase 602, it is required to check whether counters are stable or not. If counter 110 is not stable that means the clocks are too close and only very small change in frequency is required for the tunable oscillator which is just enough to make the counter 110 stable. So if counter 110 is not stable then the process directly moves to the fine tune phase 604 and if the counter 110 is stable then the process first goes through the coarse tune phase 602 and after the coarse tune phase 602 is finished the process moves to fine tune phase 604 of the state machine.

In principal the fine tune phase 604 and coarse tune phase 602 are the same except for the delays added by them for tuning the frequency of tunable oscillator 106 and entry and exit stages for each of them.

For coarse tune phase 602, if counter 110 is stable at 608 and it is the first phase of the tuning at 610 then by default some delay is added to the tunable ring stage at 612 and hence the frequency is decreased by one step. After adding the delay in tunable ring stage and decreasing the frequency at 612, new count value is compared to the previous count value at 614. If the addition of delay increases the count value then the frequencies come closer together and if it decreases the count value then frequencies move farther apart.

The coarse bit+1 at 616 reduces the delay by one step and hence increases the frequency and coarse bit−1 at 618 increases the delay by one step and hence decreases the frequency. The coarse bit+1 and coarse bit−1 after adjusting the frequency also captures the new count values and certain flags to make decision for the following step to check whether coarse tune has finished or not at 620.

If old count value is larger then coarse bit+1 step at 616 reduces the delay back again to go back to original frequency and set the direction to adjust (decrease or increase) the frequency. After adjusting Coarse tune done step at 620 cheeks whether the coarse tune is done or not and determines whether further adjustment using coarse tune is required or not. If further adjustment is not required then it moves to fine tune phase 604.

In the fine tune phase 604 the same procedure is repeated for the fine tune step. In the last step for fine tune done at 632, it also checks whether further fine tune can be done or not. If further fine tune can't be done then state machines goes to done stage at 634 and locks the frequency for tunable ring oscillator. It indicates by setting done flag high that the tuning is finished and now tunable ring oscillator can be used for small pulse width measurement.

In FIG. 5, there are 32 stages of fine tune bit stages 504 to fine tune, so it takes more time and iterations than the coarse tune that has 16 stages of coarse tune bit stages 502. Typically if noise is not too big, counter instability issue is encountered only in fine tune phase 604 and not in coarse tune phase 602. However to account any uncertainty, the algorithm in FIG. 6 accounts for counter stability in both coarse tune phase 602 at 608 and fine tune phase 604 at 612.

The unique point of state machine and algorithm illustrated in FIG. 6 is to remove and take care of the apparent frequency change due to noise/fluctuation and still find the closest possible frequencies to achieve the highest possible resolution. This process ensures that the tuning mechanism is robust and is always able to lead the counter 110 to a stable value. When the counter 110 is stable, a fine-tune-done flag is set. The tuning has been finished and the flow chart goes to "done" stage at 632. At that point, the pulse measurement phase begins which is described under FIG. 2-FIG. 4.

The advantageous features of the present disclosure include very high accuracy using Equivalent Time Sampling (ETS) where the resolution depends on the difference of two clocks, not on the frequency of an individual clock. The delay pulse is periodic with ETS scheme and there is no requirement to synchronize the phase of the two clocks. By using the differential clock approach, very small difference can results in very high resolution that is easier to achieve even on slower clocks. Also, it is easy to complete the automatic placement and routing (APR) for the integrated circuit design, because no synchronization effort is required on APR for the two differential clocks used for measurement.

The novel scheme to obtain tunable (digital programmable) ring oscillator with very small incremental steps, the frequency of one clock can be adjusted to be close to the other clock that enhances the measurement resolution. Digital output for the measured value is available for on-chip post processing. With a built in circuit to compute statistical data, higher accuracy can be achieved. For example, a built in circuit can measure the delay/timing characteristics repeatedly to account for uncertainties in silicon. Statistical data can be processed with on chip circuit or directly shifted out. With this disclosure, large sample space data collection in very short time is possible without using automatic tester equipment (ATE).

The present disclosure can not only detect the cell delay in integrated circuits with scaling technology, but can also measure other short pulses for variety of applications. For example, pulse width measurement has many other applications such as 1) Hold time for the Fast-Fast (FF) devices (i.e., relatively fast NMOS/RMOS transistors), 2) Cell rise time and fall time to characterize Fast-Slow (FS)/Slow-Fast (SF) process corner devices (i.e., combinations of relatively fast and slow NMOS/PMOS transistors), etc. in addition, the present disclosure helps to save time compared to doing direct measurement each time following conventional methodologies. A skilled person in the art will appreciate that there can be many embodiment variations of this disclosure.

Although the present disclosure and its advantages have been described in detail, it should be understood that various changes, substitutions and alterations can be made herein without departing from the spirit and scope of invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for high-resolution timing measurement, comprising:

generating a first clock with a first frequency;

generating a second clock with a second frequency;

generating a delayed pulse from the second clock;

controlling the second frequency to be as close as possible to the first frequency without being the same as the first frequency;

sampling the delayed pulse at the first frequency; and generating a digital counter value by counting a number of samples made.

2. The method of claim 1, wherein the digital counter value indicates a time width of the delayed pulse.

3. The method of claim 1, wherein the sampling of the delayed pulse is performed utilizing a D flip-flop.

4. The method of claim 1, further comprising executing statistical computations for measuring data multiple times.

5. The method of claim 1, further comprising shifting out the digital count value to an outside circuit for further processing.

6. The method of claim 1, wherein the generating the second clock is performed utilizing a tunable ring oscillator.

7. The method of claim 6, wherein the controlling the second frequency comprises adding or subtracting a first time delay to one or more coarse tuning stages in the tunable ring oscillator.

8. The method of claim 7, wherein the adding or subtracting the first time delay comprises a control signal for a multiplexer in the coarse tuning stages selecting a first input path or a second input path for an output of the coarse tuning stages, wherein the first input path goes through one or more inverters to be connected to the multiplexer, and the second input path is connected directly to the multiplexer.

9. The method of claim 7, wherein the controlling the second frequency further comprises adding or subtracting a second time delay to one or more fine tuning stages in the tunable ring oscillator, and the second time delay is shorter than the first time delay.

10. The method of claim 9, wherein the adding or subtracting the second time delay comprises a control signal turning on or turning off a first input path in the fine tuning stages, wherein the first input path and a second input path are connected in parallel to an output of the fine tuning stages, the first input path includes a first inverter and a CMOS pass transistor gate, and the second input path includes a second inverter.

11. The method of claim 9, wherein the second time delay multiplied by a number of the fine tuning stages is approximately the same as the first time delay.

12. The method of claim 1, further comprising sending a reset signal for performing at least one of sampling the delayed pulse at the first frequency and generating a digital counter value.

13. The method of claim 12, further comprising counting a number of reset signals sent for generating a digital counter value.

14. A method for high-resolution timing measurement, comprising:

generating a first clock with a first frequency;

generating a second clock with a second frequency;

generating a delayed pulse from the second clock; an oscillator tuner controlling the second frequency to be as close as possible to the first frequency without being the same as the first frequency;

sampling the delayed pulse at the first frequency utilizing a D flip-flop; and generating a digital counter value by counting a number of samples, wherein the digital counter value indicates a time width of the delayed pulse.

15. The method of claim 14, wherein the generating the second clock is performed utilizing a tunable ring oscillator.

16. The method of claim 15, wherein the controlling the second frequency comprises adding or subtracting a first time delay to one or more coarse tuning stages in the tunable ring oscillator.

17. The method of claim 16, wherein the controlling the second frequency further comprises adding or subtracting a second time delay to one or more fine tuning stages in the tunable ring oscillator, and the second time delay is shorter than the first time delay.

18. The method of claim 17, wherein the second time delay multiplied by a number of the fine tuning stages is approximately the same as the first time delay.

19. The method of claim 14, further comprising sending a reset signal for performing at least one of sampling the delayed pulse and generating a digital counter value.

20. A method for high-resolution timing measurement, comprising:

generating a first clock with a first frequency;

generating a second clock with a second frequency utilizing a tunable ring oscillator;

generating a delayed pulse from the second clock;

adding or subtracting a first time delay to one or more coarse tuning stages in the tunable ring oscillator to control the second frequency to be as close as possible to the first frequency without being the same as the first frequency;

adding or subtracting a second time delay to one or more fine tuning stages in the tunable ring oscillator to control the second frequency to be as close as possible to the first frequency without being the same as the first frequency, wherein the second time delay is shorter than the first time delay;

sampling the delayed pulse at the first frequency utilizing a D flip flop; and generating a digital counter value by counting a number of samples, wherein the digital counter value indicates a time width of the delayed pulse.

* * * * *